(12) United States Patent
Costas et al.

(10) Patent No.: US 6,443,812 B1
(45) Date of Patent: Sep. 3, 2002

(54) COMPOSITIONS FOR INSULATOR AND METAL CMP AND METHODS RELATING THERETO

(75) Inventors: Wesley D. Costas, Bear, DE (US); James Shen, Aloha, OR (US)

(73) Assignee: Rodel Holdings Inc., Wilmington, DE (US)

( * ) Notice: Subject to any disclaimer, the term of this patent is extended or adjusted under 35 U.S.C. 154(b) by 54 days.

(21) Appl. No.: 09/634,013

(22) Filed: Aug. 8, 2000

Related U.S. Application Data

(60) Provisional application No. 60/150,443, filed on Aug. 24, 1999.

(51) Int. Cl.⁷ .................................................. B24B 1/00
(52) U.S. Cl. .............................. 451/41; 51/306; 252/73
(58) Field of Search .............................. 451/41; 51/306, 51/300; 134/2; 252/73, 74, 75, 77

(56) References Cited

U.S. PATENT DOCUMENTS

| | | | | |
|---|---|---|---|---|
| 2,628,922 A | * | 2/1953 | Carlin | 427/389.7 |
| 3,423,277 A | * | 1/1969 | Hathaway, Jr. | 128/849 |
| 3,443,950 A | * | 5/1969 | Rawlins, Jr. | 430/531 |
| 3,741,914 A | * | 6/1973 | Parks | 510/214 |
| 4,458,339 A | * | 7/1984 | Wason | 367/14 |
| 5,035,762 A | * | 7/1991 | Wegner et al. | 156/230 |
| 5,257,888 A | * | 11/1993 | Kronseder | 294/65 |
| 5,545,432 A | * | 8/1996 | DeGuire et al. | 427/226 |
| 5,704,987 A | | 1/1998 | Huynh et al. | |
| 5,783,489 A | | 7/1998 | Kaufman et al. | |
| 5,914,299 A | * | 6/1999 | Harmer et al. | 51/295 |

* cited by examiner

*Primary Examiner*—M. Rachuba
(74) *Attorney, Agent, or Firm*—Kenneth A. Benson; Gerald K. Kita; Konrad Kaeding

(57) ABSTRACT

A composition is provided which is useful for the polishing of a semiconductor wafer substrate comprising an organic polymer having a backbone comprised of at least 16 carbon atoms, the polymer having a plurality of moieties with affinity to surface groups on the semiconductor wafer surface. Another composition is provided which is useful for the polishing of a semiconductor wafer substrate comprising a surfactant having a carbon chain backbone comprised of at least 16 carbon atoms.

7 Claims, No Drawings

COMPOSITIONS FOR INSULATOR AND METAL CMP AND METHODS RELATING THERETO

This application claims the benefit of U.S. Provisional Patent Application No. 60/150,443 filed Aug. 24, 1999.

BACKGROUND OF THE INVENTION

1. Field of the Invention

The present invention relates to the polishing and planarization of integrated circuit surfaces, particularly those comprising silicon dioxide films (TEOS, thermal oxide or BPSG), low-K ILD films, silicon nitride films, metal films (lines) and the mixtures of these.

2. Discussion of Related Art

CMP is an enabling technology used in the semiconductor industry to remove/planarize various thin films from the surface of semiconductor substrates during the production of IC. Various types of abrasives have been used for CMP. The polishing pad, typically made of polymer materials, is another important part in the CMP process. Particles of silicon dioxide, metal oxide (alummina, ceria, titania and ziconia etc.) or a mixture of the like are typically used as the abrasive in CMP slurries.

Achieving IC wafer planarization with smooth, scratch-free and low defect surfaces is greatly challenged by the presence of abrasive particles and the micro-asperities of the polymer pads. A CMP slurry which is not properly formulated will generate scratches and residues on the polished surfaces. The scratches may result from the trace tracks of the particles (slurry abrasives and residue from removed materials), while the residue coating may come from the gelled slurries and the re-deposition of the removed materials (metal oxide in the case of metal CMP and silanol or silicates in the case of silicon oxide CMP.) The dense scratching texture will heavily contribute to the higher level of roughness on the wafer surfaces. It has been observed that the slurry coating and re-deposition of residue will preferentially occur in the dense pattern areas, especially small features and interconnection lines in areas where the surface energy is high and the residue can be readily accommodated.

U.S. Pat. No. 5,704,987 addresses the problem of removing residual slurry particles adhered to a wafer surface after chemical-mechanical polishing. Proposed is a two step cleaning operation. The first step uses a basic aqueous solution of a nonionic polymeric surfactant; the second step uses purified water.

U.S. Pat. No. 5,783,489 discusses the use of surfactants, stabilizers, or dispersing agents to promote stabilization of a polishing slurry including oxidizing agents against settling, flocculation and decomposition. Surfactants may be anionic, cationic, nonionic, or amphoteric. It was found that the addition of a surfactant may be useful to improve the within-wafer-non-uniformity (WTWNU) of the wafers, thereby improving the surface of the wafer and reducing wafer defects.

The present invention provides compounds that can be used in CMP slurries to prevent scratching, minimize surface roughness, and eliminate coating of gelled slurries or residue on the IC wafer surfaces. The chemical compounds listed in this patent work effectively with abrasive particles including, but not limited to, silicon dioxide, metal oxides and any other inorganic oxides, and mixtures of the like. The slurries of this invention work effectively on CMP processes for sheet wafers, pattern wafers with the films/lines of silicon dioxide (TEOS, BPSG, thermal oxide), low K polymers, silicon nitride and metals, as well as mixtures of the like.

SUMMARY OF THE INVENTION

A composition is provided which is useful for the polishing of a semiconductor wafer substrate comprising an organic polymer having a backbone comprised of at least 16 carbon atoms, the polymer having a plurality of moieties with affinity to surface groups on the semiconductor wafer surface.

Another composition is provided which is useful for the polishing of a semiconductor wafer substrate comprising a surfactant having a carbon chain backbone comprised of at least 16 carbon atoms.

A further aspect of this invention is the method of polishing a semiconductor wafer substrate, wherein the substrate is pressed against a polishing pad, the substrate and the pad are moved relative to each other, and a polishing composition is applied to the pad during the polishing operation, the polishing composition comprising an organic polymer having a backbone comprised of at least 16 carbon atoms, the polymer having a plurality of moieties with affinity to surface groups on the semiconductor wafer surface.

Yet another aspect of this invention is the method of polishing a semiconductor wafer substrate, wherein the substrate is pressed against a polishing pad, the substrate and the pad are moved relative to each other, and a polishing composition is applied to the pad during the polishing operation, the polishing composition comprising a surfactant having a carbon chain backbone comprised of at least 16 carbon atoms.

The compositions of this invention may optionally further comprise one or more of the following: submicron abrasive particles, a dispersing agent, an oxidizing agent, and a complexing agent.

BRIEF DESCRIPTION OF THE FIGURES

FIG. 1 shows the effects of the addition of PVP on surface roughness.

FIG. 2 shows the effects of the addition of PVP on slurry or debris re-deposition.

DESCRIPTION OF THE PREFERRED EMBODIMENTS

Coating of polished IC wafer surfaces by preferentially adsorbed surfactants or polymers can significantly eliminate scratching and redeposition of residue. The coating layer, however, should be weakly bonded to the wafer surfaces, and be readily swept away by abrasion during CMP process, so that the materials removal rate will not be significantly reduced. The coating layers should also be readily rinsed off by DI water, or alkaline solutions in the post-CMP cleaning processes. It has been discovered that the addition of a type of surfactant or a type of polymer into the CMP slurries can effectively serve the purposes outlined above providing the additive has a carbon chain length greater than about 16. A surfactant should have a hydrophobic end containing $C_xH_{2x+1}$ with $x>16$, or have ethylene oxide chains $(OCH_2CH_2)_n$ with $n>8$, or the mixture of both. The other end of the surfactant comprises functional hydrophilic moieties attached to the hydrophobic chain described above. These moieties have affinity to surface groups (i.e., silanol, siloxane, or hydroxylized metal films or lines) contained on wafer surfaces. These functional end groups are commonly polar moieties, such as, but not limited to, hydroxyl, ether, amine oxide, phosphine oxide, sulphoxide, carboxy, carbonyl, alkoxy, sulphonyl, sulphate and phosphonyl. The polymer may be a high molecular weight organic polymer containing a carbon backbone with functional moieties extending from the backbone. The functional moieties interact strongly with the wafer surface so as to provide a protective layer. The mechanism of interaction between the functional moieties and the hydroxyl surface is most likely, though not limited to, that observed in the hydrogen bonding of polar species (such as the interaction of hydroxyl groups). The polymer compound is further defined as a high molecular weight organic material, having a degree of polymerization of at least 5 (i.e., 5 repeating monomeric units), more preferably more than 10, and most preferably greater than 50. The carbon chain backbone of the polymer should have a carbon chain length of about 16 or greater. The polymer compound comprises a plurality of moieties having affinity to surface groups (i.e., silanol, siloxane, hydroxylized metal films or lines etc.) contained on wafer surfaces. These groups are commonly polar moieties, such as, but not limited to, hydroxyl, ether, amine oxide, phosphine oxide, sulphoxide, carboxy, carbonyl, alkoxy, sulphonyl, sulphate and phosphonyl. The ratio of the number of the wafer surface affinity functional groups to the number of carbons in the backbone chain shall be between 1:1 to 1:200, preferably from 1:1 to 50, and most preferably from 1:1 to 1:10. It is also observed that block co-polymers of the above defined polymers have the same functions for the above mentioned applications. Examples of this type of molecule include, but not limited to, poly-vinyl alcohol, poly-vinylpyrrolidone, poly-methyl methacrylate, poly-formaldehyde, poly-ethylene oxide, poly-ethylene glycol, poly-methacrylic acid and the mixture of the like.

The slurries of this invention may optionally comprise a dispersant. Aqueous CMP slurries contain submicron abrasive particles. The size of these particles is important to the performance of the slurry as well as to the resultant surface quality. If the abrasive particles agglomerate, the polishing removal rates may change and the surface quality may deteriorate. Dispersants can be included in the slurry formulation to prevent this agglomeration of abrasive particles. Dispersants can be anionic, cationic, or nonionic. The selection of the proper dispersant depends on many factors including the surface characteristics of the abrasive particles and the ionic nature of the slurry formulation. Some examples of ionic surfactants include sodium lauryl sulfate, cetyl-trimethyl ammonium bromide. Amino alcohols are also used as dispersants in slurries for CMP.

An oxidizing agent may also be present in the compositions of the present invention. Examples of common oxidizing agents are nitrates, iodates, chlorates, perchlorates, chlorites, sulphates, persulphates, peroxides, ozonated water, and oxygenated water. Oxidizing agents can be used in slurries for CMP at concentrations of about 0.01% to about 7% by weight. Generally they are used at concentrations of about 1% to about 7% by weight. An iodate is a preferred oxidizing agent.

Any metal oxide or other polishing abrasive (such as alumina, ceria, zirconia, silica, titania, barium carbonate, or diamond) may be used in the slurries of this invention.

In the examples presented below, we demonstrate the reduction of wafer surface tension resulting from the adsorption of the above mentioned additives in the slurries. Examples of the surface roughness improvement and prevention of slurry/residue redeposit are also given.

EXAMPLE 1

Wafer Surface Tension Reduction by Additives in Slurries

A Cruise K-12 Tensiometer was used to determine surface tension. For surface tension measurements, the density of the slurry is measured and recorded. Wafers, cut into square sections and cleaned via torch method, are measured to determine their thickness' and widths, and then placed in a clean area for future use. The instrument is turned on and the balance is zeroed. Wafers, are attached to the balance via a clasp holder, and 80 ml of slurry is added to the appropriate sample container. During experimentation, the sample container will rise until the wafer is immersed in the slurry to a given depth. The data generated by the instrument is calculated based on weight differences experienced by the wafer as it penetrates the surface of the slurry. To determine surface tension, the surface tension software is opened, the plate method is selected, and sample parameters are entered. (e.g. Thickness, and width of the wafer, density of the slurry, and immersion depth.) The instrument is started and surface tension is calculated.

As seen in Table 1, the addition of PVP into the slurry reduces the surface tension on both TEOS and BPSG wafer surfaces, indicating that the PVP adsorbed on the surface and formed a protection layer along the surfaces.

TABLE 1

Effect of additives on surface tension of wafers

| Solution | Surface Tension on TEOS (Dyne/cm) | Surface Tension on BPSG (dyne/cm) |
| --- | --- | --- |
| D.I. Water at 25 C. | 54.3 | 68 |
| Sample A without PVP | 54.3 | 56 |
| Sample B: Sample A + 0.2 wt % PVP | 41.5 | 44 |

EXAMPLE 2

Wafer Surface Roughness Reduction

AFM images were taken of wafers from samples A & B. A Digital Instruments Dimension 5000 AFM was used to image the wafers. A 10×10 $\mu$m scan size was chosen. RMS (root mean square) roughness was measured as well as P-V (peak to valley) for all surface points. Center and edge points on the wafer were sampled.

As shown in FIG. 1, the addition of PVP improved the surface roughness significantly. Scratches were eliminated by addition of PVP.

EXAMPLE 3

Prevention of Slurry/residue Re-deposition

To illustrate the effects of PVP on extreme surface roughening and slurry residue re-deposition, an underconditioned OXP-3000 was used in a slower table and platen speed process. Sample A without PVP was used as the polishing slurry under the given conditions. This was followed by Sample B with PVP. TEOS sheet wafers were polished, buffed with DIWater, cleaned with an ammonium hydroxide solution on an OnTrak DSS-200 scrubber, and reviewed under a Leica defect review optical microscope. The Leica was set at 5× objective, which translates to a 143× total screen magnification. Normarski prism mode was used to enhance contrast.

As seen in FIG. 2, slurry deposition or polishing debris re-deposition was eliminated by adding PVP into the polishing slurries, indicating that the PVP coating layer on the wafer prevented slurries or debris from directly depositing on wafer surface.

EXAMPLE 4

Prevention of Slurry/residue Re-deposition

Several polymers and surfactants were used in this Example in which slurry/residue re-deposition was measured as in Example 3. It was surprisingly found that the polymers and surfactants which prevent the re-deposition of slurry/residue must have a carbon chain length of at least about 16. We cannot generally say that all polymers and surfactants containing the functional moieties mentioned above will be effective. The molecules must be large enough to form a film thick enough to be a preventative to the slurry/residue re-deposition.

For the following slurry/redeposition tests, TEOS wafers were polished on a Strsbaugh 6DS-SP polisher under the following conditions. ILD1300 polishing slurry available from Rodel, Inc., Newark, Del. was used with 0.2% by weight of the surfactant or polymer additive.

TABLE 2

Effect of carbon chain length.

| Additive | Manufacturer | Type | Approximate Carbon Chain Length | Slurry/residue re-deposition |
|---|---|---|---|---|
| Polyvinylpyrrolidone (Mw~10,000) | Sigma/Aldrich | Polymer | 180 | No |
| Polyvinylalcohol (Mw~40,000) | Air Products | Polymer | 1600+ | No |
| Amphoterge KJ-2 | Lonza | Amphoteric Surfactant | 9–5 | Yes |
| BRIJ-58 | ICI Surfactants | Nonionic Surfactant | 56 | No |
| Zonyl FSP | Dupont | Anionic Surfactant | 4–16 | Yes |

Table 2 shows that the carbon chain length must be about 16 or greater for the additive to be effective in preventing slurry/residue redeposition. It has also been found that suitable additives are particularly effective when used with a polishing pad with a relatively hard surface such as an OXP3000 pad available from Rodel, Inc., Newark, Del.

What is claimed is:

1. A composition useful for the polishing of integrated circuit surfaces comprising an organic polymer having a backbone comprised of at least 16 carbon atoms, said polymer having a plurality of moieties with affinity to surface groups on said semiconductor wafer surface.

2. A composition according to claim 1 wherein said moieties consist of one or more of the following groups: hydroxyl, ether, amine oxide, phosphine oxide, sulphoxide, carboxy, carbonyl, alkoxy, sulphonyl, sulphate, and phosphonyl.

3. A composition according to claim 1 wherein said organic polymer is from the group consisting of poly-vinyl alcohol, poly-vinylpyrrolidone, poly-methyl methacrylate, poly-formaldehyde, poly-ethylene oxide, poly-ethylene glycol, and poly-methacrylic acid.

4. A composition according to claim 3 wherein said organic polymer is poly-vinylpyrrolidone.

5. A composition useful for the polishing of integrated circuit surfaces comprising a surfactant having a carbon chain backbone comprised of at least 16 carbon atoms.

6. A method of polishing a semiconductor wafer substrate, wherein said substrate is pressed against a polishing pad, said substrate and said pad are moved relative to each other, and a polishing composition is applied to said pad during the polishing operation, said polishing composition comprising an organic polymer having a backbone comprised of at least 16 carbon atoms, said polymer having a plurality of moieties with affinity to surface groups on said semiconductor wafer substrate.

7. A method of polishing a semiconductor wafer substrate, wherein said substrate is pressed against a polishing pad, said substrate and said are moved relative to each other, and a polishing composition is applied to said pad during the polishing operation, said polishing composition comprising a surfactant having a carbon chain backbone comprised of at least 16 carbon atoms.

* * * * *